United States Patent
Abe (10) Patent No.: US 6,617,848 B2
(45) Date of Patent: Sep. 9, 2003

(54) MAGNETIC HEAD MEASURING APPARATUS AND MEASURING METHOD APPLIED TO THE SAME APPARATUS

(75) Inventor: Masayuki Abe, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/062,571

(22) Filed: Feb. 5, 2002

(65) Prior Publication Data

US 2002/0130658 A1 Sep. 19, 2002

(30) Foreign Application Priority Data

Feb. 5, 2001 (JP) ........................................ 2001-028551

(51) Int. Cl.⁷ .......................... G01R 33/02; G01R 33/12
(52) U.S. Cl. .......................... 324/210; 324/244; 73/105
(58) Field of Search ........................ 324/210, 244–263; 73/105; 250/306; 360/31

(56) References Cited

U.S. PATENT DOCUMENTS

| | | | | |
|---|---|---|---|---|
| 5,440,121 A | * | 8/1995 | Yasutake et al. | ............ 250/306 |
| 5,623,205 A | * | 4/1997 | Tomita et al. | ............. 324/244 |
| 5,652,377 A | * | 7/1997 | Yagi | ............................ 73/105 |
| 6,437,562 B2 | * | 8/2002 | Abe | ........................... 324/210 |

OTHER PUBLICATIONS

D. Rugar, et al., "Magnetic Force Microscopy: General Principles and Application to Longitudinal Recording Media", J. Appl. Phys. 68(3), Aug. 1990, pp. 1169–1183.

* cited by examiner

Primary Examiner—N. Le
Assistant Examiner—Reena Aurora
(74) Attorney, Agent, or Firm—Pillsbury Winthrop LLP (57) ABSTRACT

A magnetic head measuring apparatus executes measurement with respect to at least one measurement point on a recording head. The apparatus includes a probe having a magnetic substance, a vibrator which vibrates the probe above the at least one measurement point, a first signal generator which supplies a drive signal to the vibrator, a second signal generator which supplies a current containing a direct current and an alternate current to the recording head to generate a magnetic field from the recording head, a detector configured to detect a signal corresponding to a force interaction that acts on the probe due to the magnetic field generated from the recording head in accordance with the current supplied by the second signal generator, and a measurement unit which measures current dependence of the magnetic field of the recording head from the signal detected by the detector.

16 Claims, 5 Drawing Sheets

# MAGNETIC HEAD MEASURING APPARATUS AND MEASURING METHOD APPLIED TO THE SAME APPARATUS

CROSS-REFERENCE TO RELATED APPLICATIONS

This application is based upon and claims the benefit of priority from the prior Japanese Patent Application No. 2001-028551, filed Feb. 5, 2001, the entire contents of which are incorporated herein by reference.

BACKGROUND OF THE INVENTION

1. Field of the Invention

The present invention relates to a magnetic head measuring apparatus for measuring magnetic field characteristics of a magnetic head and a measuring method applied to the magnetic head measuring apparatus.

2. Description of the Related Art

Conventionally, in the process of manufacturing a magnetic head used for, e.g., a hard disk drive, a process of measuring magnetic field characteristics such as field distribution or field saturation phenomenon of a recording head (write head) included in the magnetic head is indispensable. A recording head is formed from, e.g., an inductive thin-film head and has a magnetic gap for generating a recording field corresponding to a signal current applied to the coil.

As the measurement schemes in the measuring process, (1) a scheme using a measuring apparatus called a spin stand dedicated to a head/disk, (2) a scheme using a dedicated magnetic head measuring apparatus using a magnetic force microscope (MFM), and (3) a scheme using computer simulation are known.

In the measuring scheme using a spin stand, a signal for measurement is recorded on a disk recording medium while changing a write current value for a recording head to be measured, and the recorded signal is reproduced by a reproduction head (read head). With the spin stand, magnetic field characteristics of the recording head is measured using the recorded signal output from the reproduction head.

In the measuring scheme using an MFM, a DC (Direct Current) is applied to the recording head, and a DC magnetic field (recorded magnetic field) generated from the recording head is measured by the MFM.

In the scheme using computer simulation, a DC magnetic field (recorded magnetic field) generated from the recording head when a DC (Direct Current) is applied to the recording head is obtained by simulation on a computer.

The various kinds of conventional measuring schemes described above have the following problems.

In the measuring scheme using a spin stand, since a recorded signal is measured through a disk recording medium and reproduction head (MR head), a measurement result including the characteristics of these components is obtained. For this reason, the saturation magnetic field of the recording head cannot be directly observed. In addition, a saturation phenomenon is assumed to occur from a corner (edge) of a magnetic pole of a recording head. However, with this measuring scheme, this phenomenon cannot be locally detected.

In the measuring scheme using an MFM, since a saturation field is measured by supplying only a DC, an improvement of resolving power cannot be expected. When a current value of DC is increased, a very large magnetic field is generated from a recording head. For this reason, an interaction between a probe used in the MFM and a recording field from the recording head ranges not only to the distal end portion of the probe but also to the rear surface portion of the probe. Additionally, since the interaction at the rear surface portion of the probe includes a magnetic field from the neighborhood of the probe, the interactive effect at the rear surface portion of the probe becomes very large. Hence, contribution from the distal end portion of the probe relatively decreases, resulting in a decrease in resolving power.

Furthermore, in the computer simulation, the actual field distribution of a recording head cannot be measured.

BRIEF SUMMARY OF THE INVENTION

The present invention provides a magnetic head measuring apparatus capable of realizing direct observation of a saturation field as magnetic field characteristics of a recording head at a high resolving power and consequently improving recording head measurement performance, and a measuring method applied to the magnetic head measuring apparatus.

According to one aspect of the present invention, there is provided a magnetic head measuring apparatus for executing measurement with respect to at least one measurement point on a recording head, comprising: a probe having a magnetic substance; a vibrator configured to vibrate the probe above the at least one measurement point; a first signal generator configured to supply a drive signal to the vibrator; a second signal generator configured to supply a current containing a direct current (DC) and an alternate current (AC) to the recording head to generate a magnetic field from the recording head; a detector configured to detect a signal corresponding to a force interaction that acts on the probe due to the magnetic field generated from the recording head in accordance with the current supplied by the second signal generator; and a measurement unit configured to measure current dependence of the magnetic field of the recording head from the signal detected by the detector.

According to another aspect of the present invention, there is provided a measuring method applied to a magnetic head measuring apparatus for executing measurement with respect to at least one measurement point on a recording head, the method comprising: supplying a current containing a direct current (DC) and an alternate current (AC) to the recording head to generate a magnetic field from the recording head; bringing a probe having a magnetic substance close to the recording head while vibrating the probe; detecting a signal corresponding to a force interaction that acts on the probe due to the magnetic field generated from the recording head; and measuring current dependence of the magnetic field of the recording head from the detected signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention will be described below with reference to the accompanying drawing.

Arrangement of Magnetic Head Measuring Apparatus

Figure 1:
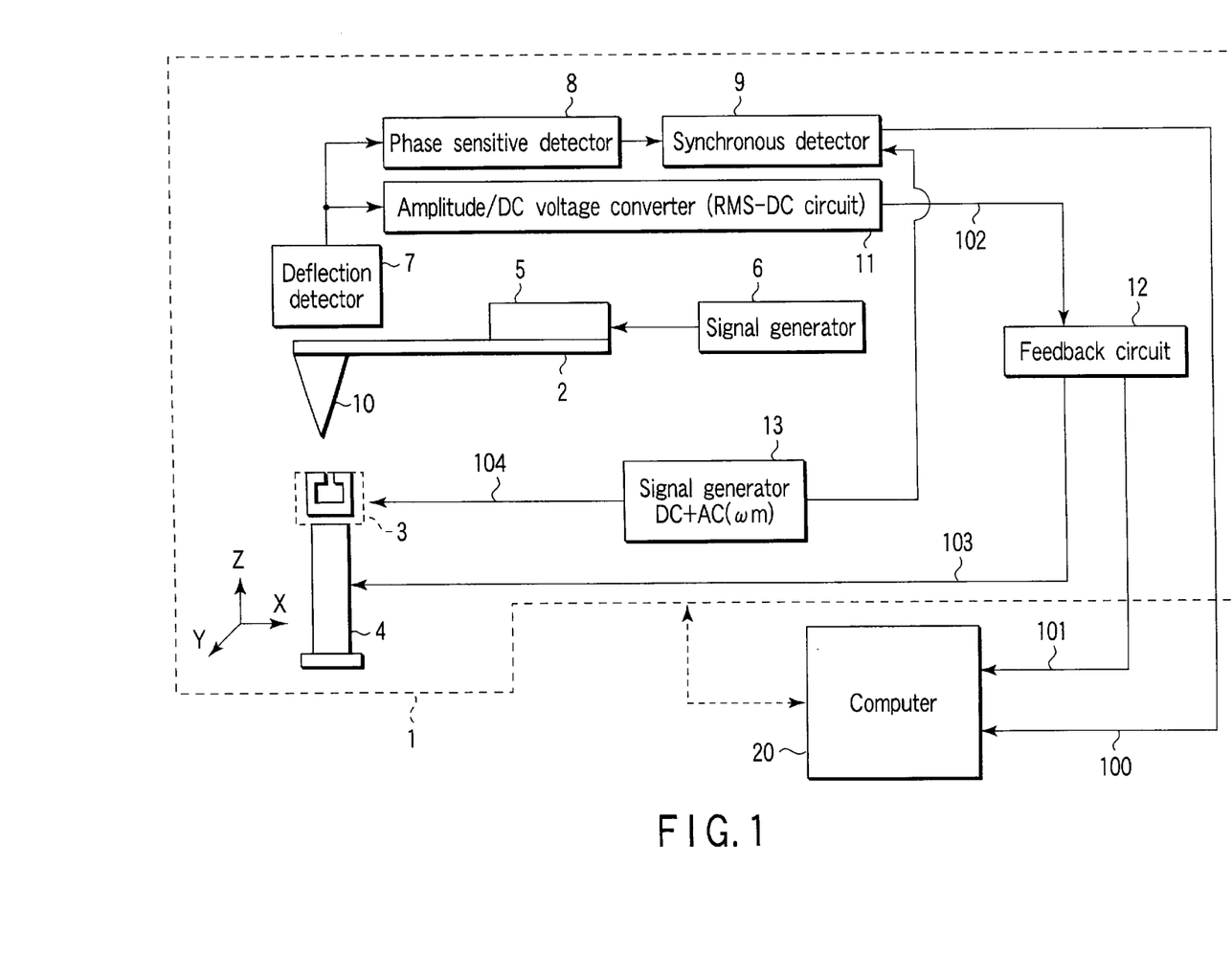
FIG. 1 is a block diagram showing main part of a magnetic head measuring apparatus according to an embodiment of the present invention.

A measuring apparatus of this embodiment is roughly divided into a measuring apparatus main body 1 and computer 20, as shown in FIG. 1. The measuring apparatus main body 1 is an apparatus dedicated to measure magnetic field characteristics of a recording head (to be sometimes referred to as a sample) 3 using a magnetic force microscope (MFM). The MFM is a kind of scanning probe microscope. The MFM normally brings a probe mounted on a cantilever (leaf spring member) close to a sample to be measured and detects a magnetic field generated from the sample in a non-contact state using a magnetic force interaction (force or force gradient).

The measuring apparatus main body 1 has a cantilever 2 that supports a probe 10 formed from (or coated with) a magnetic substance, and an actuating piezoelectric element 5 which applies a vibration having a constant vibration amplitude to the cantilever 2. The actuating piezoelectric element 5 vibrates the cantilever 2 at the mechanical resonance frequency ($\omega r$) of the cantilever 2 or a frequency near the mechanical resonance frequency in accordance with a drive signal from a signal generator 6.

On the other hand, a sample, i.e., the recording head 3 to be measured is held by a scanning piezoelectric element 4 which is three-dimensionally driven and controlled along the X-, Y-, and Z-axes. The scanning piezoelectric element 4 has a function of changing the three-dimensional relative position and relative distance between the sample 3 and the probe 10 in accordance with a control signal from a feedback circuit 12 (to be described later).

The measuring apparatus main body 1 also has a deflection detector 7 for detecting deflection of the cantilever 2 that supports the probe 10, a phase sensitive detector 8, a synchronous detector 9, and an amplitude/DC voltage converter 11. The phase sensitive detector 8 detects the phase shift between the output signals from the deflection detector 7 and signal generator 6. The synchronous detector 9 measures an AC (Alternate Current) component from the signal output from the phase sensitive detector 8 (outputs a measurement signal 100). That is, the synchronous detector 9 extracts an amplitude component (corresponding to an image of derivative of the magnetic field in terms of a DC current) synchronous with an AC frequency corresponding to the magnetic field of the recording head 3, which is detected by the force interaction of the probe 10.

The amplitude/DC voltage converter 11 converts the amplitude value of the AC signal from the output signal of the deflection detector 7 into a DC (Direct Current) signal 102 and outputs the DC signal 102 to the feedback circuit 12. The feedback circuit 12 outputs a signal for maintaining the amplitude of the output signal 102 from the amplitude/DC voltage converter 11 constant as a drive control signal 103 for the scanning piezoelectric element 4 and also to the computer 20 as a detection signal 101 of the surface shape (topographical image) of the sample 3.

A signal generator 13 corresponds to a circuit having a current source for supplying a signal current 104 for measurement to the coil of the recording head, i.e., sample 3. The signal current 104 contains DC and AC components. The signal current 104 contains an AC having a very small amplitude (with angular oscillation frequency ($\omega m$))

The computer 20 controls the entire measuring apparatus main body 1. The computer 20 also has a function of processing each of the measurement signal 100 corresponding to an image of derivative of the magnetic field in terms of a DC current, which is measured by the measuring apparatus main body 1, and the measurement signal 101 corresponding to the surface shape (topographical image) of the sample so as to evaluate the measurements. The computer 20 also sets all measurement conditions for the apparatus main body 1 or acquires the operation state. More specifically, the computer 20 sets the time constant of the feedback circuit 12 and the scanning range of the scanning piezoelectric element 4. The computer 20 also sets operation conditions such as a frequency, amplitude, and offset to generate signal currents from the signal generators 6 and 13.

The scanning piezoelectric element 4 is assumed to have a structure fixed with respect to the recording head 3. However, any other structure capable of changing the relative positions of the probe 10 and recording head 3 can be used.

Measurement Procedure

Figure 2:
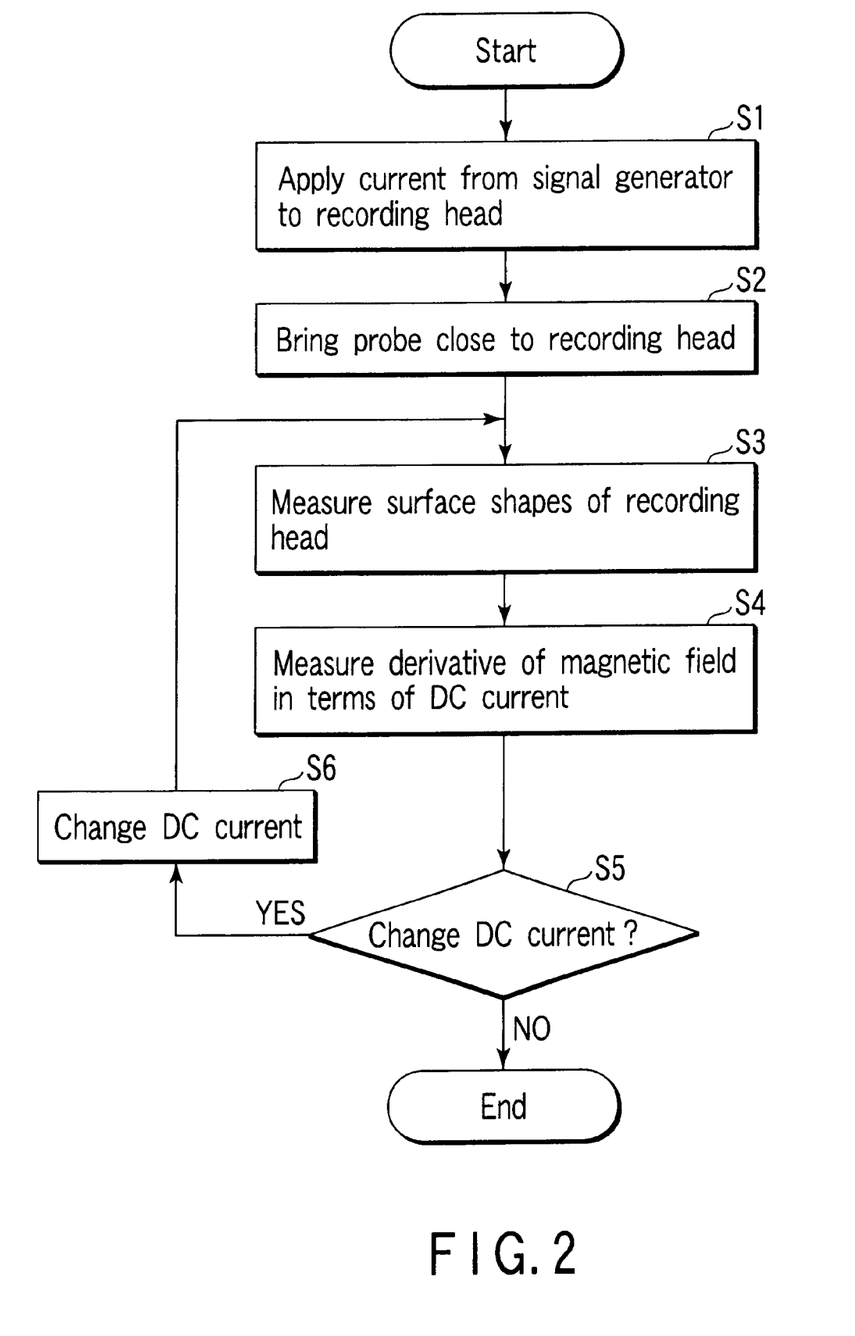
FIG. 2 is a flow chart for explaining the measurement procedure in the embodiment.

The measurement procedure of this embodiment will be described below with reference to the flow chart shown in FIG. 2 and also FIGS. 3A to 4B.

First, the signal current 104 is supplied from the signal generator 13 to the coil of the recording head, i.e., sample 3 (step S1). The signal current 104 contains DC and AC components. The AC has a very small amplitude (with angular oscillation frequency $\omega m$).

As the amplitude of the AC signal becomes smaller, a signal corresponding to derivative of the magnetic field in terms of a DC current can be more precisely obtained. However, when the detection sensitivity of the MFM is taken into consideration, a certain amplitude is necessary. Since the maximum value of the amplitude of an actual recording head is 30 to 40 mA, the amplitude of the AC is ideally about 3 mA or less.

However, if the current is too small, an AC component $F_{AC}$ of measured interaction becomes smaller than noise in the measurement system to make it difficult to execute predetermined measurement. Hence, a current value with which a signal more than the noise level can be obtained must be set. Normally, when noise in circuits of the measurement system is reduced, thermal noise of the cantilever 2 becomes dominant. This noise is defined by statistical thermodynamics and therefore cannot be removed. Hence, measurement must be done while satisfying a condition given by $$F_{AC} > \frac{1}{A}\sqrt{\frac{4K_B TQB}{k\omega_r}}$$

where A is the vibration amplitude, Q is the Q value, k is the spring constant, and ωr is the and resonance frequency of the cantilever. $K_B$ and T are a Boltzman constant and temperature. B indicates the band width of the measurement system. In the measurement of this embodiment, the band width of the low-pass filter of the synchronous detector 9 is the band B. The actual magnitude of $F_{AC}$ changes depending on the shape of the probe, or the material, sputtering conditions, and film thickness of the magnetic substance.

On the other hand, the frequency (ωm) of the AC contained in the signal current 104 must be 1/10 the resonance frequency (ωr) of the cantilever 2 or less. The frequency (ωm) is the modulation frequency of the amplitude modulation frequency. The frequency (ωm) is converted into a modulation frequency with phase modulation by the interaction between the probe 10 and the magnetic field, which has a carrier frequency corresponding to the resonance frequency of the cantilever 2. Hence, it has been confirmed by experiments that the maximum value of the frequency (ωm) depends on the resonance frequency (corresponding to the vibration frequency of the probe 10) of the cantilever 2 and cut-off frequency of the low-pass filter which is included in the phase sensitive detector, and sensitive measurement cannot be performed if the frequency (ωm) is not 1/10 the resonance frequency (ωr) or less.

In accordance with supply of the signal current 104, a magnetic field (recording field) is generated from the gap of the recording head 3. In this state, when the probe 10 is brought close to the recording head 3, a force interaction by the magnetic field acts on the probe 10 (step S2).

On the other hand, to measure the surface shape (topographical image) of the sample 3, the computer 20 switches measurement operation to receive the measurement signal 101 output from the feedback circuit 12. That is, the scanning piezoelectric element 4 is controlled to change the three-dimensional relative position and relative distance between the sample 3 and the probe 10 in accordance with a control signal from the feedback circuit 12.

The signal generator 6 is caused to supply a signal having the mechanical resonance frequency (ωr) of the cantilever 2 or a frequency near the mechanical resonance frequency to the actuating piezoelectric element 5. The actuating piezoelectric element 5 vibrates the probe 10 through the cantilever 2. The probe 10 scans the recording head 3 while making the distal end portion lightly contact (tap) the surface of the recording head 3.

The feedback circuit 12 drives and controls the scanning piezoelectric element 4 such that the output signal 102 from the amplitude/DC voltage converter 11 obtains a constant amplitude (such that the distance between the probe and the sample becomes constant). At this time, the feedback circuit 12 outputs the drive control signal to the computer 20 as the detection signal 101 of the surface shape (topographical image) of the recording head 3 (step S3).

The force interaction acting on the probe 10 is detected by the phase sensitive detector 8 as a phase shift between the vibration of the cantilever 2 measured by the deflection detector 7 and the signal generated by the signal generator 6.

The synchronous detector 9 outputs a signal synchronous with the AC (Alternate Current) component of the force interaction (i.e., the magnetic field of the recording head) as the measurement signal 100. The measurement signal 100 is an amplitude component synchronous with the AC frequency (ωm). The measurement signal 100 corresponds to derivative of the magnetic field in terms of a DC current (dH/dI) obtained by differentiating a magnetic field H generated from the recording head by a current I.

The computer 20 causes the probe 10 to scan the gap range of the recording head 3, thereby receiving the measurement signal 100 to measure an image of derivative of the magnetic field in terms of a DC current (step S4).

It is determined whether a DC current is to be changed (step S5). If yes, the DC current is changed (step S6) and steps S3 and S4 are repeated. If no, the processing is terminated.

In this way, an image of derivative of the magnetic field in terms of a DC current (measurement signal 100) as magnetic field characteristics of the recording head 3 and the surface shape (topographical image) of the recording head 3 are measured by the measuring apparatus main body 1 and computer 20.

Figure 3A:
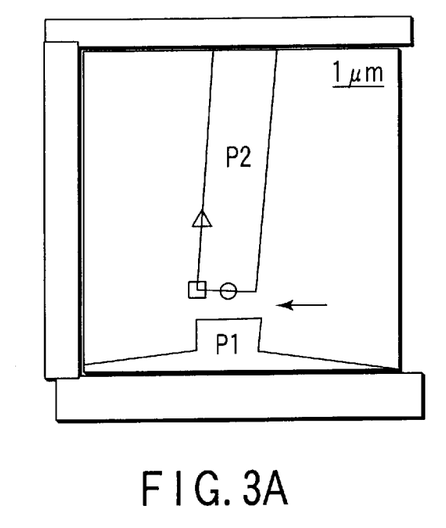
FIGS. 3A and 3B are views for explaining derivative of the magnetic field in terms of a DC current obtained in the embodiment.
Figure 3B:
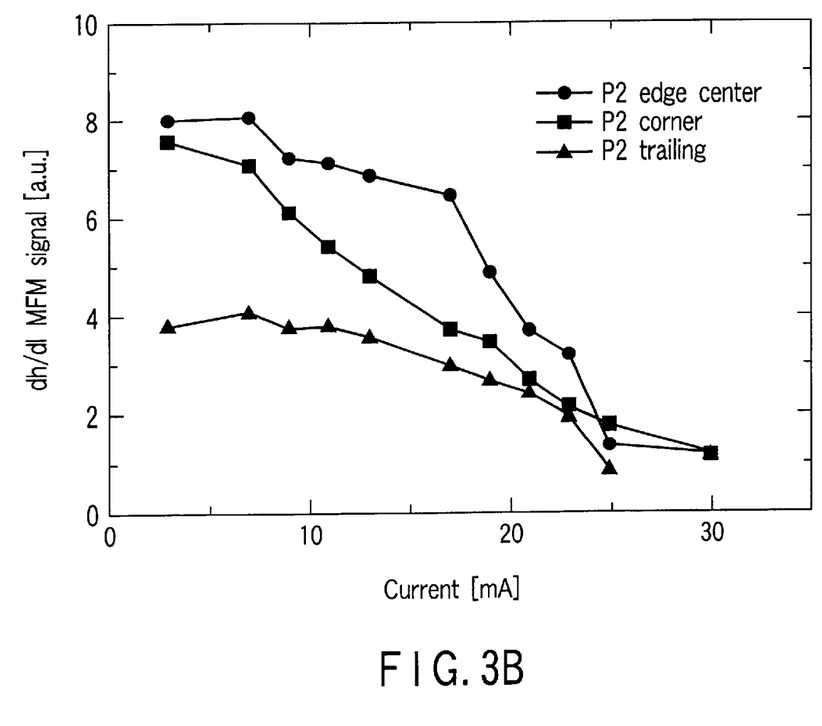

FIGS. 3A and 3B are views for explaining derivative of the magnetic field in terms of a DC current, obtained in this embodiment.

The derivative of the magnetic field in terms of a DC current (dH/dI) obtained in this embodiment changes depending on the position (portion) of the recording head (the value has site dependence).

As shown in FIG. 3A, for magnetic poles P1 and P2 of the recording head, for example, measurement of three portions on the magnetic pole P2 side (gap edge center portion (○), corner portion (□), and trailing portion (△) of the magnetic pole P2 in FIG. 3A) will be examined. FIG. 3B shows the current dependence of a force gradient by dH/dI (to be referred to as a dH/dI force gradient hereinafter) at the three portions.

As shown in FIG. 3B, at the gap edge center, since the value dH/dI is becoming constant to about 10 mA, saturation starts at about 10 mA. At the corner portion, since the dH/dI force gradient is uniformly attenuated from a small current, saturation has already started even at a small current value. At the trailing portion of the magnetic pole P2, since the dH/dI force gradient is smaller than the remaining two portions, the field strength gradient with respect to the current is small. In addition, since the dH/dI force gradient is flat to about 15 mA, the value dH/dI monotonically increases until 15 mA and then saturation starts. In the measurement according to this embodiment, the saturation phenomenon of the recording head changes depending on the position.

Figure 4A:
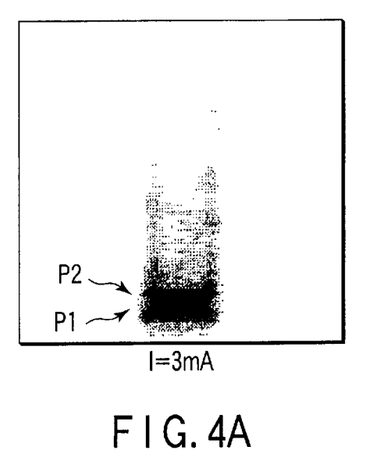
FIGS. 4A and 4B are views showing image data obtained in the embodiment.
Figure 4B:
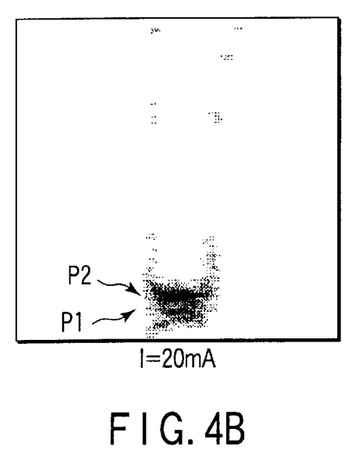

The computer 20 executes predetermined signal processing for the measurement signal 100 obtained from the measuring apparatus main body 1 to convert an image of derivative of the magnetic field in terms of a DC current, i.e., the measurement result into image data by black contrast, as shown in FIGS. 4A and 4B. When the image data is output and displayed on the screen of a display, the magnetic field characteristics (saturation phenomenon) of the recording head 3 can be directly visually observed.

FIG. 4A shows an image of derivative of the magnetic field in terms of a DC current when current value I of the DC of the signal current supplied to the recording head 3 is 3 mA. FIG. 4B shows an image of derivative of the magnetic field in terms of a DC current when current value I of the DC is 20 mA.

Referring to FIG. 4A, a magnetic field (derivative) distribution (black contrast) can be confirmed along the edge corner of the magnetic poles P1 and P2 of the gap of the recording head 3. Referring to FIG. 4B, it can be confirmed that black contrast around the edge of the magnetic poles P1 and P2 disappears, and the magnetic field (derivative) is almost zero, i.e., field saturation occurs at the magnetic pole edge. The computer 20 can calculate a curve of derivative of the magnetic field in terms of a DC current and further calculate a curve of the magnetic field in terms of the DC current from a measurement result obtained by changing the current value of the DC of the signal current 104, and output the curves onto the display.

As described above, in this embodiment, an image of derivative of the magnetic field in terms of a DC current and surface shape (topographical image) of the recording head 3 can be measured. Hence, when an image is generated by the computer 20 from the derivative of the magnetic field in terms of a DC current as a measurement result, the magnetic field characteristics (field saturation phenomenon) of the recording head 3 can be visually observed. In addition, when a curve of derivative of the magnetic field in terms of a DC current and then a curve of the magnetic field in terms of the DC current are calculated from a measurement result obtained by changing a current value of the DC, measurement evaluation can be done at a high resolving power.

First Modification

Figure 5:
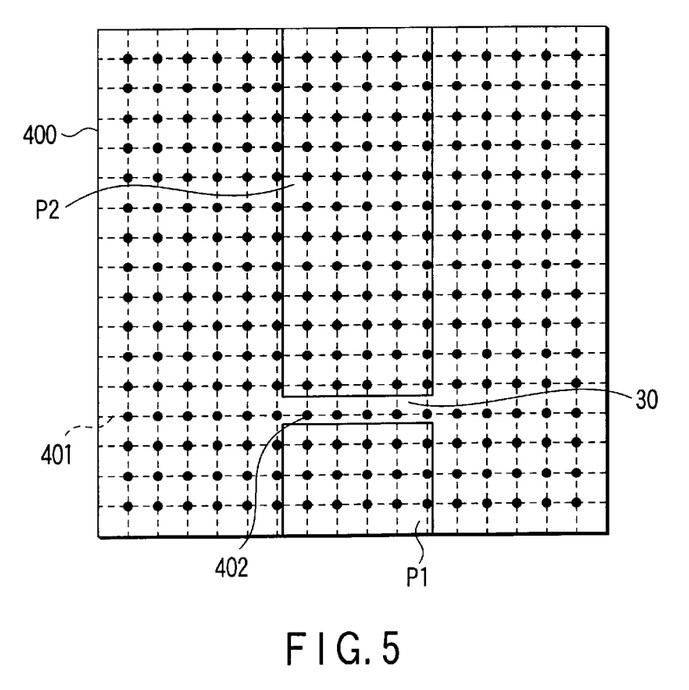
FIG. 5 is a view for explaining a modification of the measuring method of the embodiment.

FIG. 5 is a view for explaining a modification of the measuring method of this embodiment. FIG. 5 conceptually shows a scanning range 400 of the probe 10 with respect to the recording head 3, scanning lines 401 (dashed lines), and measurement positions 402 indicated by solid dots.

In this modification, in the scanning range 400, the probe 10 is scanned (scanning line 401) near the magnetic poles P1 and P2 of the recording head 3 (gap 30). The scanning is temporarily stopped at the preset measurement position 402. The computer 20 stores a measurement result (derivative of the magnetic field in terms of a DC current) obtained from the synchronous detector 9 by changing a current value of the DC of the signal current 104 supplied to the recording head 3, while keeping scanning stopped. The computer 20 analyzes a plurality of measurement results (derivatives of the magnetic field in terms of a CD current) obtained by changing the current value of the DC to calculate a curve of the derivatives of the magnetic field in terms of the DC current. Then the computer 20 calculates a curve of the magnetic field in terms of the DC current from the curve of the derivatives of the magnetic field in terms of the DC current at each predetermined measurement position 402 of the probe 10.

According to this modification, since scanning by the probe 10 can be executed simultaneously with changing the current value of the DC, a curve of the magnetic field in terms of a DC current and a curve of the magnetic field in terms of a DC current can be calculated in a short time.

Second Modification

Figure 6:
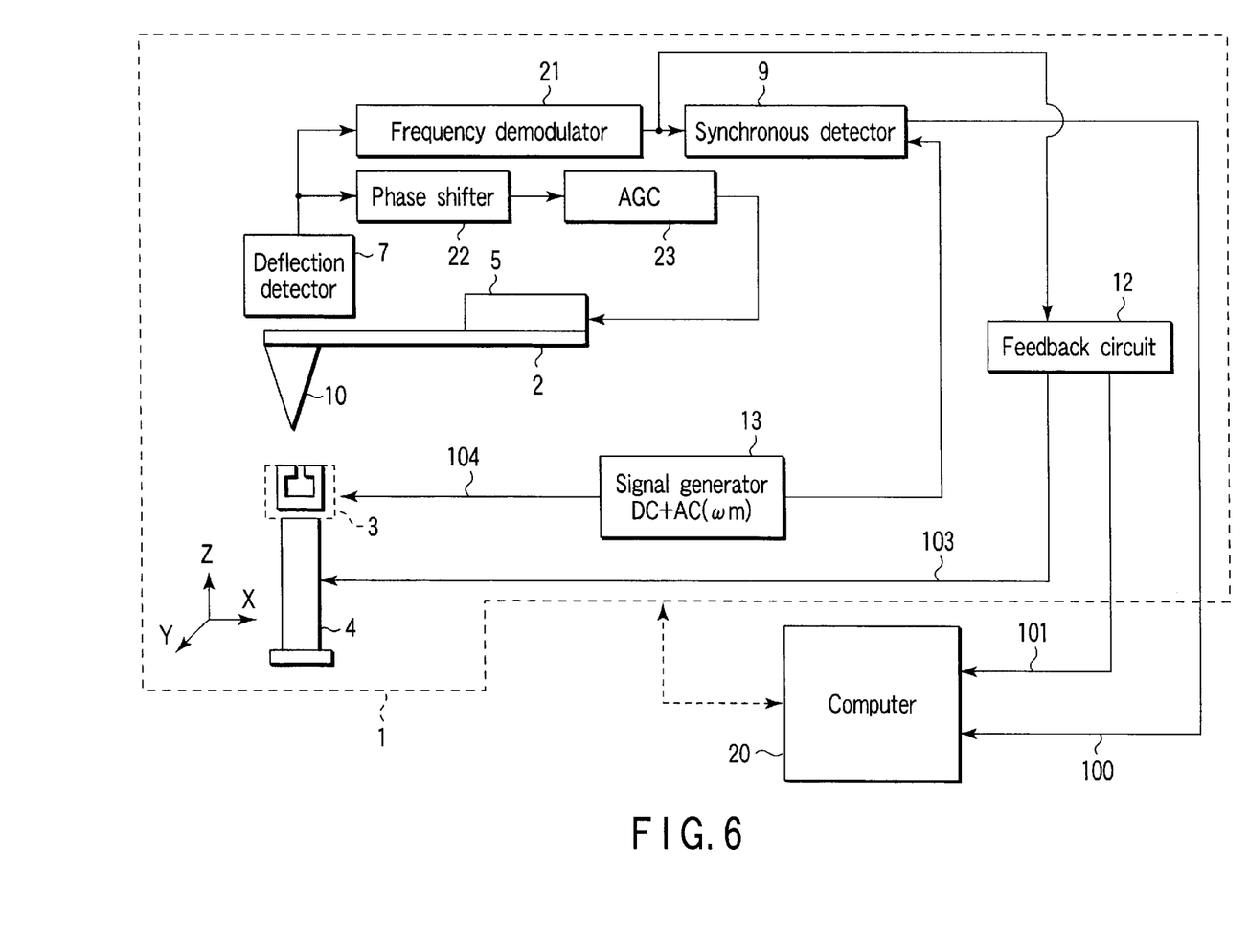
FIG. 6 is a block diagram showing a modification of the magnetic head measuring apparatus shown in FIG. 1.

FIG. 6 is a block diagram showing a modification of the magnetic head measuring apparatus shown in FIG. 1.

In the above-described magnetic head measuring apparatus shown in FIG. 1, the phase shift between the signal from the deflection detector 7 and the signal generated by the signal generator 6 is detected using the phase sensitive detector 8. In the magnetic head measuring apparatus shown in FIG. 6, a frequency demodulator 21 is used to detect the frequency of the signal from the deflection detector 7, instead of the phase sensitive detector 8.

Additionally, the above-described magnetic head measuring apparatus shown in FIG. 1 has the amplitude/DC voltage converter 11. Instead, a phase shifter 22 and AGC (Automatic Gain Control) circuit 23 are arranged to form a phase control mechanism for frequency detection. In this case, the phase shifter 22 outputs a signal having a phase shift of a predetermined angle with respect to the signal output from the deflection detector 7. The AGC circuit 23 automatically controls the gain of its output to make the signal output of the deflection detector or the signal to the piezoelectric elements constant. With the constitution, it is possible to appropriately actuate the cantilever 2 with maintaining the phase to be constant. That is, the deflection detector 7, phase shifter 22, AGC circuit 23, actuating piezoelectric element 5, cantilever 2, and probe 10 form a positive feedback control system (oscillation system) for phase control.

In the above arrangement, the synchronous detector 9 measures an AC (Alternate Current) component from the signal output from the frequency demodulator 21 (outputs the measurement signal 100). That is, the synchronous detector 9 extracts an amplitude component (corresponding to an image of the magnetic field in terms of a DC current) synchronous with the AC corresponding to the magnetic field of the recording head 3, which is detected by the force interaction of the probe 10.

The output signal from the frequency demodulator 21 is sent not only to the synchronous detector 9 but also to the feedback circuit 12. Hence, the feedback circuit 12 can generate the signal 103 for driving and controlling the scanning piezoelectric element 4 and the detection signal 101 of the surface shape (topographical image) of the sample 3 by using the output signal from the frequency demodulator 21, as in the magnetic head measuring apparatus shown in FIG. 1.

Even in this modification, the same effect as that of the magnetic head measuring apparatus shown in FIG. 1 can be obtained.

As has been described above in detail, according to the present invention, in a magnetic head measuring apparatus for measuring magnetic field characteristics of a recording head included in a magnetic head using a magnetic force microscope (MFM), when a measured image of the magnetic field in terms of a DC current is converted into an image by predetermined signal processing, a saturation phenomenon of a magnetic field from a magnetic pole edge of the recording head can be visually observed. In addition, by changing the current value to be supplied to the recording head, current dependence of the magnetic field (corresponding to a curve of the magnetic field in terms of a DC current) of the recording head can also be obtained. That is, a saturation field as magnetic field characteristics of a recording head can be directly observed at a high resolving power, and consequently, the recording head measurement performance can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic head measuring apparatus for executing measurement with respect to at least one measurement point on a recording head, comprising:

a probe having a magnetic substance;

a vibrator configured to vibrate said probe above the at least one measurement point;

a first signal generator configured to supply a drive signal to said vibrator;

a second signal generator configured to supply a current containing a direct current (DC) and an alternate current (AC) to the recording head to generate a magnetic field from the recording head;

a detector configured to detect a signal corresponding to a force interaction that acts on said probe due to the magnetic field generated from the recording head in accordance with the current supplied by said second signal generator; and a measurement unit configured to measure current dependence of the magnetic field of the recording head from the signal detected by said detector.

2. The apparatus according to claim 1, wherein said detector includes:

a deflection detector configured to detect deflection of said probe, a phase sensitive detector configured to detect a phase shift between output signals from said deflection detector and first signal generator, and a synchronous detector configured to extract an amplitude component synchronous with the AC from a signal output from said phase sensitive detector.

3. The apparatus according to claim 1, wherein said detector includes:

a deflection detector configured to detect deflection of said probe, a frequency demodulator configured to detect a frequency of an output signal from said deflection detector, and a synchronous detector configured to extract an amplitude component synchronous with the AC from a signal output from said frequency demodulator.

4. The apparatus according to claim 3, further comprising a phase controller configured to control a phase of an output signal from said first signal generator on the basis of the output signal from said deflection detector.

5. The apparatus according to claim 1, wherein said measurement unit obtains an image of the magnetic field in terms of a DC current on the basis of the signal detected by said detector.

6. The apparatus according to claim 1, wherein said measurement unit obtains a curve of derivative of the magnetic field in terms of a DC current at an arbitrary measurement point on the recording head on the basis of a signal obtained by said detector by changing a current value of the DC supplied by said second signal generator.

7. The apparatus according to claim 6, wherein said measurement unit obtains a curve of the magnetic field in terms of the DC current at the arbitrary measurement point on the recording head on the basis of the curve of the derivative of the magnetic field in terms of the DC current.

8. The apparatus according to claim 1, wherein the AC supplied by said second signal generator contains an amplitude modulation current.

9. An apparatus according to claim 1, wherein an amplitude value of the AC is not more than 3 mA.

10. The apparatus according to claim 1, wherein said vibrator includes a cantilever which supports said probe, and a frequency of the AC is not more than $1/10$ a resonance frequency of said cantilever.

11. A measuring method applied to a magnetic head measuring apparatus for executing measurement with respect to at least one measurement point on a recording head, said method comprising:

supplying a current containing a direct current (DC) and an alternate current (AC) to the recording head to generate a magnetic field from the recording head;

bringing a probe having a magnetic substance close to the recording head while vibrating the probe;

detecting a signal corresponding to a force interaction that acts on the probe due to the magnetic field generated from the recording head; and measuring current dependence of the magnetic field of the recording head from the detected signal.

12. The method according to claim 11, wherein in the signal detection, an amplitude component synchronous with the AC is extracted from the signal corresponding to the force interaction.

13. The method according to claim 11, wherein in the measurement, an image of derivative of the magnetic field in terms of a DC current is obtained from the detected signal.

14. The method according to claim 11, wherein in the measurement, a curve of derivative of the magnetic field in terms of the DC current at an arbitrary measurement point on the recording head is obtained on the basis of a signal obtained in the signal detection by changing a current value of the DC supplied.

15. The method according to claim 14, wherein in the measurement, a curve of the magnetic field in terms of the DC current at the arbitrary measurement point on the recording head is obtained on the basis of the curve of the derivative of the magnetic field in terms of the DC current.

16. The method according to claim 11, wherein in the measurement, a range including a plurality of measurement points on the recording head is scanned by the probe, at each measurement point, a current value of the DC supplied is changed while keeping scanning stopped, and the current dependence of the magnetic field of the recording head is measured on the basis of the signal obtained in the signal detection in accordance with a change of the current value of the DC supplied.

* * * * *